(12) United States Patent
Saito et al.

(10) Patent No.: US 7,914,692 B2
(45) Date of Patent: *Mar. 29, 2011

(54) METHODS OF GENERATING PLASMA, OF ETCHING AN ORGANIC MATERIAL FILM, OF GENERATING MINUS IONS, OF OXIDATION AND NITRIDING

(75) Inventors: Takao Saito, Nagoya (JP); Yoshimasa Kondo, Nagoya (JP); Tatsuya Terazawa, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 695 days.

This patent is subject to a terminal disclaimer.

(21) Appl. No.: 11/843,771

(22) Filed: Aug. 23, 2007

(65) Prior Publication Data
US 2008/0122368 A1 May 29, 2008

Related U.S. Application Data

(60) Provisional application No. 60/887,021, filed on Jan. 29, 2007.

(30) Foreign Application Priority Data

Aug. 29, 2006 (JP) ................. P2006-232520

(51) Int. Cl.
*B44C 1/22* (2006.01)
*C03C 15/00* (2006.01)
*C03C 25/68* (2006.01)
*C23F 1/00* (2006.01)

(52) U.S. Cl. ............... 216/67; 438/714; 204/192.12

(58) Field of Classification Search ............ 216/67, 216/71; 438/714; 204/192.12
See application file for complete search history.

(56) References Cited

U.S. PATENT DOCUMENTS

| 5,763,319 | A | 6/1998 | Ling et al. | |
| 5,863,831 | A | 1/1999 | Ling et al. | |
| 6,054,063 | A * | 4/2000 | Ohtake et al. | 216/70 |
| 6,217,704 | B1 | 4/2001 | Kitagawa | |
| 6,447,849 | B1 * | 9/2002 | Watanabe et al. | 427/525 |
| 6,632,482 | B1 * | 10/2003 | Sheng | 427/523 |
| 6,670,276 | B1 | 12/2003 | Suemasa et al. | |
| 6,902,683 | B1 * | 6/2005 | Kaji et al. | 216/71 |
| 2001/0031543 | A1 | 10/2001 | Ando et al. | |
| 2002/0040766 | A1 | 4/2002 | Takahashi et al. | |

(Continued)

FOREIGN PATENT DOCUMENTS

JP 09-312280 12/1997

(Continued)

OTHER PUBLICATIONS

U.S. Appl. No. 12/042,525, filed Mar. 5, 2008, Saito.

(Continued)

*Primary Examiner* — Roberts Culbert
(74) *Attorney, Agent, or Firm* — Burr & Brown (57) ABSTRACT

A direct current pulse voltage is applied on a treatment gas to generate a discharge plasma. The duty ratio of the direct current pulse voltage is controlled within the range of 0.0001% or more and 8.0% or less. The rise time of the direct current pulse voltage is controlled in the range of not lower than 0.1 V/nsec and not higher than 10000 V/nsec. Alternatively, a positive pulse and a negative pulse are applied from a single power source for performing the discharge plasma and the impurity implantation.

13 Claims, 7 Drawing Sheets

U.S. PATENT DOCUMENTS

| | | |
|---|---|---|
| 2002/0060207 A1 | 5/2002 | Coccio et al. |
| 2003/0230938 A1 | 12/2003 | Hatano et al. |
| 2004/0161534 A1 | 8/2004 | Saito et al. |
| 2004/0219797 A1 | 11/2004 | Honda et al. |
| 2005/0230351 A1 | 10/2005 | Tahara |
| 2006/0156984 A1 | 7/2006 | Nozawa et al. |
| 2006/0157449 A1 | 7/2006 | Takahashi et al. |
| 2007/0175587 A1 | 8/2007 | Saito et al. |

FOREIGN PATENT DOCUMENTS

| | | |
|---|---|---|
| JP | 10-219456 | 8/1998 |
| JP | 2000-124190 | 4/2000 |
| JP | 2001-118830 | 4/2001 |
| JP | 2002-509641 | 3/2002 |
| JP | 2002-151295 | 5/2002 |
| JP | 2003-234331 | 8/2003 |
| JP | 2004-055362 | 2/2004 |
| JP | 2004-270022 | 9/2004 |
| JP | 2004-337345 | 12/2004 |
| JP | 3639795 | 1/2005 |
| JP | 3647303 | 2/2005 |
| JP | 2005-085586 | 3/2005 |
| JP | 2005-508068 | 3/2005 |
| JP | 2005-129484 | 5/2005 |
| JP | 2005-159049 | 6/2005 |
| JP | 3705977 | 8/2005 |
| JP | 2005-251837 | 9/2005 |
| JP | 3811681 | 6/2006 |
| JP | 2006-219748 | 8/2006 |
| JP | 2007-194110 | 8/2007 |
| WO | 2004/107430 | 12/2004 |

OTHER PUBLICATIONS

Saito et al., "High-Speed Synthesis of DLC Film by Using Bipolar Nanopulse Plasma Source", Proceedings of the 112th Lecture Conference (with English translation), Oct. 5, 2005, pp. 1-7.

Saito et al., "High-Speed Synthesis of DLC Film by Using Bipolar Nanopulse Plasma Source", Handout distributed in the Proceedings of the 112th Lecture Conference (with English translation), Oct. 5, 2005, pp. 1-28.

Saito et al., "Evaluation of nanopulse plasma and its application to DLC film deposition", Proceedings of the Division Conference of the Institute of Electrical Engineers of Japan (with English translation), Aug. 22, 2005, pp. 1-23.

Saito et al., "Evaluation of nanopulse plasma and its application to DLC film deposition", Handout distributed in the Proceedings of the Division Conference of the Institute of Electrical Engineers of Japan (with English translation), Aug. 22, 2005, pp. 1-50.

* cited by examiner

METHODS OF GENERATING PLASMA, OF ETCHING AN ORGANIC MATERIAL FILM, OF GENERATING MINUS IONS, OF OXIDATION AND NITRIDING

FIELD OF THE INVENTION

The present invention relates to a discharge plasma generation method, an organic material film etching method, a negative ion production method and an oxidation or nitriding treatment method.

BACKGROUND OF THE INVENTION

Japanese Patent Publication No. 2004-270022A discloses the use of a nanopulse power source with a pulse width of not greater than 1000 nsec for forming diamond-like carbon films at atmospheric pressure.

Japanese Patent Publication No. H09 (1997)-312280A describes that the off-state time in pulse discharge be set at 0.5 µs to 30 µs to sustain pulse discharge. The duty ratio of the direct-current pulse voltage is high, namely not lower than 10%, and the so-called microwaves (high-frequency waves of 2.45 GHz) are pulsed.

Japanese Patent No. 3705977B mentions that the modulation period be 10 µs to 500 µs and the duty ratio be 10% to 80%. In this method, too, pulsed high-frequency waves of 0.4 MHz to 13.56 MHz are used as a plasma generation source in etching processes.

In Japanese Patent Publication No. 2005-159049A, a plasma generation method according to which the high-frequency cycle period is 10 kHz to 100 kHz and the duty ratio is 40% to 60% is utilized in film formation.

Japanese Patent Publication No. 2000-124190A describes a plasma source where the electron temperature is within the range of 0.25 eV to 1 eV; used as this plasma source are microwaves (0.3 GHz to 1 GHz).

In Japanese Patent No. 3639795B, an electron temperature of not higher than 3 eV and an electron density of not higher than $2\times10^8$ cm$^{-3}$ are obtained by providing an electric power resulting from superposition of polarity inversion pulses. However, no control is imposed on the off-state time of pulses, and the electron density is very low.

Japanese Patent Publication No. 2003-234331A describes a method for plasma etching of organic material (low-k) films using an inorganic material film as a mask. It also describes that when a high plasma density is obtained, the self-bias also increases and, as a result, organic material films are damaged. Japanese Patent Publication No. 2001-118830A also describes about the damages.

Further, a process for ashing organic material (low-k) films is described in Japanese Patent Publication No. 2005-251837A.

And, Japanese Patent No. 3647303B describes a method of generating negative ions using temporal afterglow. Those negative ions are used for etching. Owing to the negative ions, abnormal etching patterns resulting from surface electrification, electrostatic breakdown of gate oxide films and/or deflected ions are avoided.

Moreover, a plasma ion implantation process is described in Japanese Patent (laid-open under PCT) Publication No. 2002-509641A. However, intermittent voltage application at 20 keV, for instance, results in increased thermal implantation into wafers, sometimes leading to progress of diffusion in excess of the desired implantation depth.

And an oxidation or nitriding process is described in WO2004/107430.

SUMMARY OF THE INVENTION

In thin film deposition or etching and impurity implantation processes, high-electron-density plasmas are indispensable. For film quality control and for reducing damages to substrates in a plasma atmosphere, low-electron-temperature plasmas have attracted attention. However, it is difficult to generate and sustain those discharge plasmas which are simultaneously high in electron density and low in electron temperature.

To solve such problem, the present inventors disclosed, in Japanese Patent Application No. 2006-12264A, that discharge plasmas are generated by applying a direct-current pulse voltage on a treatment gas and the duty ratio of the direct-current pulse voltage is controlled within the range of from 0.001% to 8.0%, inclusive.

It is an object of the present invention to generate and utilize a discharge plasma with an increased electron density and a lowered electron temperature.

According to a first aspect, the invention provides a plasma generation method for generating a discharge plasma, the method comprising the step of;

applying a direct-current pulse voltage on a treatment gas, wherein the direct-current pulse voltage has a duty ratio controlled within the range of 0.001% or more and 8.0% or less, and wherein the direct-current pulse voltage has a voltage rise time of 0.1V/nsec or more and 10000V/nsec or less.

According to a second aspect, the invention provides a method of impurity implantation into a semiconductor, the method comprising the step of:

generating a discharge plasma by applying a direct-current pulse voltage on a treatment gas, wherein the direct-current pulse voltage has a duty ratio controlled within the range of 0.001% or more and 8.0% or less, and wherein the discharge plasma generation and impurity implantation are carried out while applying a positive pulse and a negative pulse from one power source.

According to a third aspect, the invention provides a method of etching an organic material film, the method comprising the steps of:

applying a direct-current pulse voltage on a treatment gas to generate a discharge plasma, the direct-current pulse voltage having a duty ratio controlled within the range of 0.001% or more and 8.0% or less; and utilizing the treatment gas after the generation of the discharge plasma as a plasma source for etching an organic material film with respect to an inorganic material film.

According to a fourth aspect, the invention provides a negative ion production method, the method comprising the steps of:

applying a direct-current pulse voltage on a treatment gas to generate a discharge plasma, the direct-current pulse voltage having a duty ratio controlled within the range of 0.001% or more and 8.0% or less; and utilizing treatment gas after the generation of the discharge plasma as a plasma source for negative ion production.

According to a fifth aspect, the invention provides an oxidation or nitriding treatment method, the method comprising the steps of:

applying a direct-current pulse voltage on a treatment gas to generate discharge plasma generation, the direct-current pulse voltage having a duty ratio controlled within the range of 0.001% or more and 8.0% or less; and utilizing the treatment gas after the generation of the discharge plasma as a plasma source for carrying out the oxidation or nitriding treatment.

The present invention further provides a semiconductor substrate treatment apparatus comprising:

a ceramic or metal stage for mounting a semiconductor substrate thereon,
an inlet port for a plasma treatment gas,
an evacuation port,
counter electrodes, and
a power source for generating a direct-current pulse voltage having a duty ratio controlled within the range of 0.001% or more and 8.0% or less.

In the prior art, plasma generation is generally carried out using a power source resulting from pulsing of a high-frequency power source. Therefore, the off-state time of the pulse has not been controlled, and the duty ratio of the pulse has been always high. This is presumably due to the fact that power sources of the type resulting from pulsing of a high-frequency power source show a high pulse duty ratio.

The present inventor attempted to markedly reduce the duty ratio of a direct-current pulse voltage for discharge plasma formation and maintenance and prolong the quiescent time of the pulse. As a result, it was found that the electron temperature can be markedly lowered under such conditions that the plasma electron density can be maintained at a high level.

Accordingly, it has been ascertained that such plasma generation method can suitably be applied to various treatment processes.

DETAILED DESCRIPTION OF THE INVENTION

In accordance with the present invention, the duty ratio of the direct-current pulse voltage is controlled within the range of from 0.001% to 8.0%, inclusive. By lowering the duty ratio to 8.0% or below, it becomes possible to maintain the discharge plasma electron density at a high level and lower the electron temperature. In a preferred embodiment of the invention, the duty ratio is preferably not higher than 5%, more preferably not higher than 3%, and still more preferably not higher than 1%. From the practical viewpoint, however, it is difficult to reduce the duty ratio to a level lower than 0.001%.

The pulse voltage duty ratio is expressed by the following formula.

Duty ratio(%)=(sum of on-state times of pulses/pulse period)×100

The "on-state time of pulse" denotes the time from the start of the rise of a pulse to the completion of the fall of the pulse.

The "sum of on-state times of pulses" is the sum of on-state times of all pulses included in one period.

When a positive pulse with a period of 1000 μsec and with an on-state time of 1 μsec is applied, for instance, the duty ratio is (1μsec/1000μsec)×100=0.1%.

In cases where a positive pulse and a negative pulse are included in each period, the sum of the positive pulse on-state time and negative pulse on-state time is divided by one period. For example, when a positive pulse with an on-state time of 1 μsec and a negative pulse with an on-state time of 2 μsec are applied within each period of 1000 μsec, the duty ratio is (1μsec+2μsec)/1000μsec=0.3%.

In accordance with the invention, when an electric power per discharge electrode unit area of not lower than $1.0\ W/cm^2$ is supplied, the discharge plasma electron density can amount to a level not lower than $1\times10^{10}\ cm^{-3}$, more preferably to a level not lower than $5\times10^{10}\ cm^{-3}$. The discharge plasma electron temperature can amount to a level not higher than 1.5 eV, more preferably to a level not higher than 1.0 eV.

In a preferred mode of embodiment, the discharge plasma is a glow discharge plasma, although it may be a hollow cathode discharge, streamer discharge or arc discharge plasma.

The direct-current pulse voltage frequency is not particularly restricted but preferably is not lower than 0.1 kHz and not higher than 100 kHz.

The treatment gas pressure is not particularly restricted but the present invention is most effective in such processes that a discharge plasma is generated under low pressure conditions. From this viewpoint, the treatment gas pressure is preferably not higher than 100 Pa, more preferably not higher than 50 Pa. There is no particular lower limit to that pressure.

In the practice of the invention, it is particularly preferred that at least one of a positive pulse and a negative pulse be applied; by this, a thin film, for instance, can be formed with high efficiency. In this case, the pattern of application of the positive pulse and/or negative pulse is not particularly restricted. The positive pulse may be applied consecutively for more than once, or the negative pulse may be applied consecutively more than once.

In the practice of the invention, the pulse half width (in the case of a bipolar pulse, the pulse half width of each of the positive pulse and negative pulse) is preferably not in excess of 3000 nsec, more preferably not in excess of 1000 nsec. Thereby, the discharge plasma electron density can be increased. In the case of a direct-current pulse voltage waveform 10 shown by way of example in FIG. 1, a positive pulse 11 and a negative pulse 12 are applied alternately and periodically at a certain definite interval. In the figure, d1 is the half width of the positive pulse 11 and d2 is the half width of the negative pulse 12.

Figure 1:
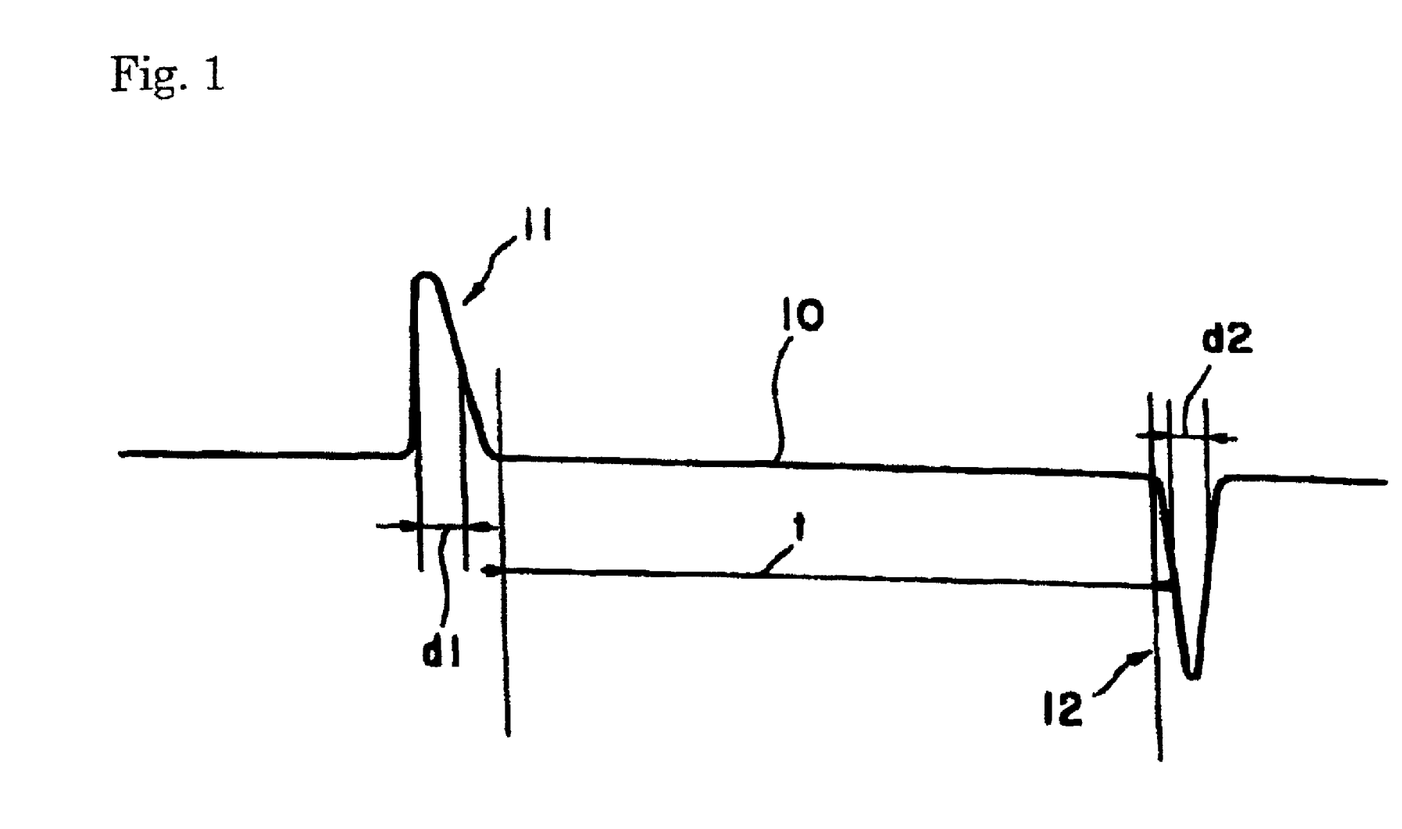
FIG. 1 is a schematic exemplary view of a positive pulse and a negative pulse.

The size of the positive pulse 11 is not particularly restricted but, for example, the electric field strength between the counter electrodes is preferably selected within the range of from 0.01 kV/cm to 100 kV/cm, more preferably within the range of from 0.1 kV/cm to 50 kV/cm.

The size of the negative pulse 12 is not particularly restricted but, for example, the electric field strength between the counter electrodes is preferably selected within the range of from −0.01 kV/cm to −100 kV/cm, more preferably within the range of from −0.1 kV/cm to −50 kV/cm.

In the practice of the invention, a plasma is generated within the space between the counter electrodes. On that occasion, it is possible to place a dielectric on at least one of the counter electrodes, although the metal electrodes may be exposed. As the structure of the counter electrodes, there may be mentioned, for example, the structure comprising parallel flat plates, cylindrical, spherical or hyperbolic opposing flat plates, or coaxial cylinders.

As examples of the solid dielectric for covering one or both of the counter electrodes, there may be mentioned plastics such as polytetrafluoroethylene, polyethylene terephthalate or the like, glass, metal oxides such as silicon dioxide, aluminum oxide, aluminum nitride, zirconium dioxide, titanium dioxide or the like, and composite oxides such as barium titanate or the like.

The dielectric preferably has a thickness of 0.05 mm to 4 mm. The distance between the counter electrodes is not particularly restricted but preferably is 1 mm to 500 mm. As the base material, there may be mentioned, among others, plastics such as polyethylene, polypropylene, polystyrene, polycarbonates, polyethylene terephthalate, polyphenylene sulfide, polyetheretherketones, polytetrafluoroethylene and acrylic resins or the like, glass, ceramics and metals. The shape of the dielectric is not particularly restricted but may be a plate-like or film-like shape or any of various three-dimensional shapes.

In the practice of the invention, a plasma is generated by applying a direct-current pulse voltage between the counter electrodes. On that occasion, the pulse waveform of each of positive and negative pulses is not particularly restricted but may be of impulse type, square (rectangular) wave type, or modulated wave type. A direct-current bias voltage may be applied simultaneously.

Figure 2:
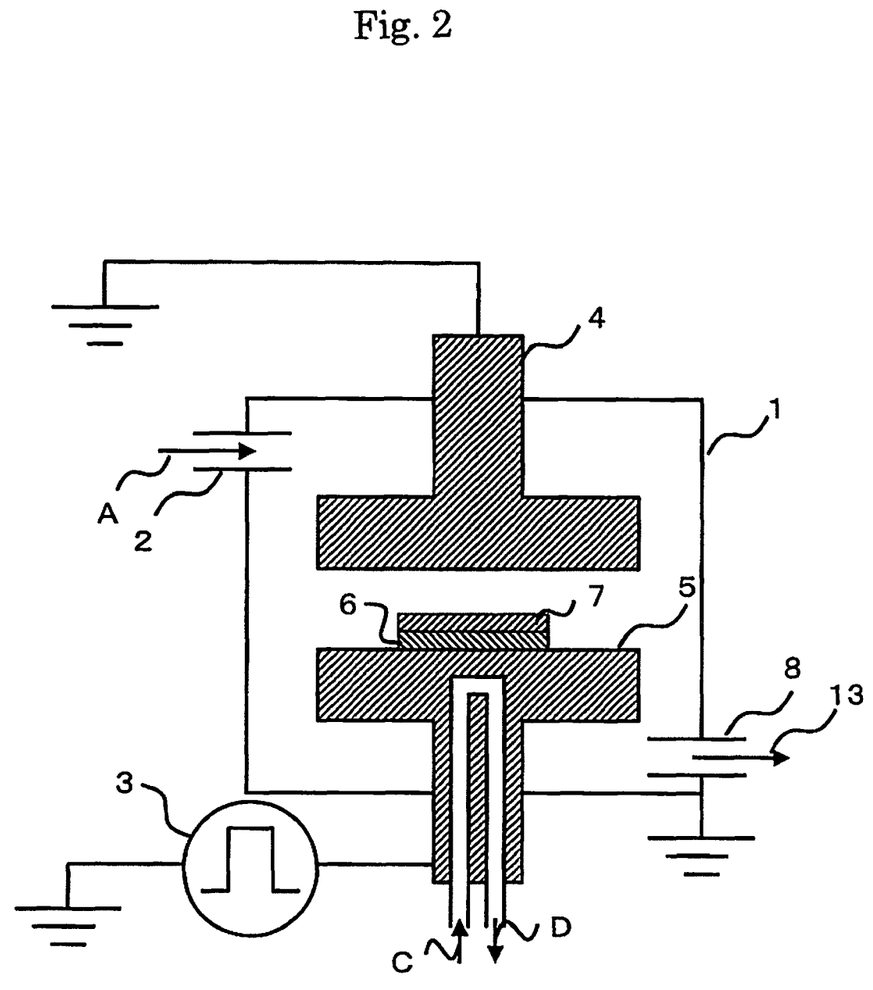
FIG. 2 is a schematic view of a film formation apparatus utilizable in the practice of the invention.

FIG. 2 is a schematic view of an apparatus utilizable in the practice of the present invention. A discharge plasma is generated in a chamber 1. A substrate 6 is placed on a lower electrode 5, the substrate 6 and an upper electrode 4 are facing each other, and a discharge plasma is generated within the space between them. A raw material gas is fed through a gas supply port 2 of the chamber 1, as indicated by the arrow A, and a positive pulse- and negative pulse-containing direct-current pulse voltage is applied from a power source 3 in which an electrostatic induction thyristor device is in between the electrodes, for plasma generation. The used gas is discharged through an outlet port 8, as indicated by the arrow B. A refrigerant channel 9 is formed within the lower electrode 5, and a refrigerant is passed through the channel 9, as indicated by the arrows C and D. By this, temperature of the substrate 6 is controlled within a predetermined temperature range, for example from 20° C. to 1000° C.

Figure 4:
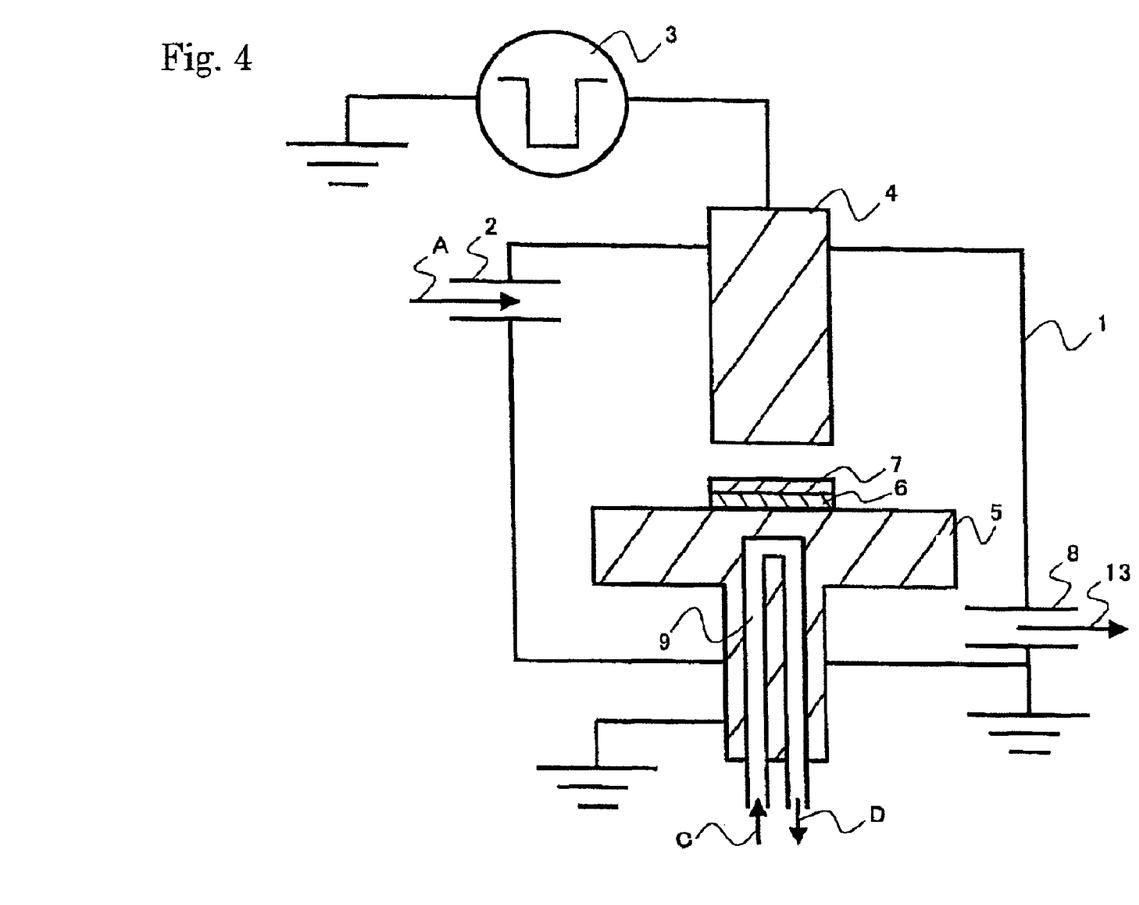
FIG. 4 is a schematic view of a film formation apparatus utilizable in the practice of the invention.

In the example shown in FIG. 4, the lower electrode 5 is grounded, and the upper electrode 4 is connected to the power source 3. A direct-current pulse power source is applied from the power source 3.

The raw material gas, after mixing up of all components, can be fed into the chamber 1. When the raw material gas comprises a plurality of gas species, including a diluent gas, the gases may be separately fed into the chamber 1 through respective separate feeding ports.

The direct-current pulse voltage can be applied by means of a steep pulse generating power source. As such power source, there may be mentioned, for example, a power source utilizing an electrostatic induction thyristor device which does not require any magnetic compression mechanism, and a power source utilizing a thyratron equipped with a magnetic compression mechanism, a gap switch, an IGBT device, a MOF-FET device, or an electrostatic induction thyristor device.

Specifically, the one described in Japanese Patent No. 3811681B can preferably be utilized as such power source device.

In the first aspect of the invention, it is further required that the direct-current pulse voltage rise time be such that the rise rate amounts to a level not lower than 0.1 V/nsec and not higher than 10000 V/nsec.

When the direct-current rise time (voltage increase per unit time) is short (sharp), specifically 0.1 V/nsec or higher, the plasma distribution at the electrode end becomes uniform and the in-plane plasma homogeneity improves. The term "in-plane homogeneity" as used herein refers not only to a two-dimensional plane but also a three-dimensional morphology including a concave-convex structure or a trench structure.

From this viewpoint, the direct-current pulse voltage rise time is preferably such that the rise rate is 1.0V/nsec or higher, more preferably 10V/nsec or higher.

Such a sharp direct-current pulse voltage rise time can be favorably utilized in film formation from the uniformity viewpoint, in particular in impurity implantation in semiconductor processes as well.

In the second aspect of the invention, the treatment gas after the discharge plasma generation is utilized as a plasma source for impurity implantation into semiconductors. On that occasion, the discharge plasma generation and impurity implantation are carried out by applying positive pulses and negative pulses from one power source. For example, a positive pulse is applied for plasma generation, and a next negative pulse is applied for drawing ions to the electrode side and thereby causing impurity implantation into a semiconductor.

In the first aspect and second aspect of the invention, the duty ratio of the direct-current pulse voltage is not higher than 8.0%. This means that the time over which heat is substantially injected into the semiconductor by the pulse voltage is short and the quiescent time is long. As a result, the semiconductor hardly undergoes thermal influences on the occasion of ion implantation and, therefore, the implantation depth is inhibited from becoming deep in excess of the desired depth, hence implantation to a definite desired depth can be readily realized. In this respect, the discharge plasma generation method of the invention is useful.

The ion implantation utilizing discharge plasma can be carried out according to the method described in Japanese Patent Kohyo Publication No. 2002-509641, for instance, while the plasma is generated according to the present invention.

In producing p-type areas, the dopant can be selected from among boron (B), aluminum (Al), gallium (Ga), indium (In) and other group-IIIA for example. In implanting such dopant into a substrate, the substrate can be selected from among diamond substrates, silicon substrates, germanium substrates and other group-IVA element substrates. Silicon is a substrate material in common use. In producing n-type areas, the dopant can be selected from among phosphorus (P), antimony (Sb), arsenic (As) and other group-VA. Phosphorus or arsenic is preferred, however.

The element constituting a compound of the dopant element is preferably silicon or germanium, although it may be fluorine. Tin (Sn) and lead (Pb) can also be used.

The dopant often used for forming thin p-type areas is a boron compound comprising three elements. It comprises the same element as the substrate material, and an element capable of forming a solid solution with the substrate material, for example germanium. For example, $Si_xGe_yB_z$ can form thin p-type areas on a silicon substrate.

Phosphorus and arsenic are dopants also commonly used in n-type areas. In forming n-type impurity-doped areas, compound ions derived from $Si_xP_y$, $Ge_xP_y$, $Si_xGe_yP_z$, or $Si_xAs_y$, $Ge_xAs_y$, $Si_xGe_yAs_z$, and the like can be used, among others.

Boron compounds represented by $Si_xB_y$, for example $SiB_2$, $SiB_4$, $SiB_6$, and the like can be purchased on the market. Each compound can form $Si_xB_y$ compound ions differing in atom number ratio. The compounds each occurs as a powdery solid at room temperature or ordinary temperature.

Other chemical products capable of being ionized and producing compound ions for implantation can also be used. For example, such boron compounds as $B_xH_y$ and $(CuH_vO_w)_xB_y$, and such silicon compounds as $Si_xH_y$, $Si_xC_yH_z$, $(C_mH_n)_xSi_y$ $(O_uC_vH_w)_z$, $Si_vC_xH_yO_z$, and the like can be used. As for the germanium compounds, $Ge_xB_y$, $Ge_xH_y$, $Ge_xC_yH_z$, $Ge_vC_x$-$H_yO_z$, $(C_mH_n)_xGe_y(O_uC_vH_w)_z$, and the like can be used. Organic silicon compounds in various phases (solid, liquid, gas), including $Si_wC_xH_yB_z$, $Si_vC_wH_xO_yB_z$, $Si_wH_xN_yB_s$, $Si_vC_wH_xN_yB_z$, and the like can all be used. Further, organometallic compounds in various phases (solid, liquid, gas), for example $Ge_wB_xC_yH_z$, and the like can also be used. The subscripts in the molecular formulas indicate the numbers of the respective atoms in the compounds.

Generally, p-type compound ions are formed from a compound containing an element of the group-IVA and a compound containing an element of the group-IIIA of the periodic table of the elements. Similarly, n-type compound ions are formed from a compound containing an element of the group-IVA and a compound containing an element of the group-VA. For example, $Si_xB_y$ compound ions are synthesized from $SiH_4$ and $BH_3$ as raw materials. $Ge_xB_y$ compound ions are synthesized from $GeH_4$ and $BH_3$ as raw materials.

In the third aspect of the invention, a discharge plasma is generated while the duty ratio of the direct-current pulse voltage is controlled within the range of from 0.001% to 8.0%, inclusive, and the discharge plasma is used in etching an organic material film with an inorganic material film as a mask.

According to this method, the organic material film is etched utilizing a high-density plasma at a low electron temperature and the organic material film can be prevented from being damaged. In the step of ashing of an organic material film, the film can be inhibited from being damaged in the same manner.

The etching or ashing of an organic material film can be carried out according to the description in Japanese Patent Publication No. 2003-234331A and in Japanese Patent Publication No. 2001-118830A, while utilizing the discharge plasma obtained in accordance with the present invention.

Thus, the etching of an organic material film using an inorganic material film as a mask is carried out at a high etching rate and at a high etching selectivity ratio with respect to the inorganic material film.

As the etching treatment gas, for example, at least one species selected from among $N_2$ gas, $H_2$ gas, $O_2$ gas, CO gas, $NH_3$ gas, gases represented by $C_xH_y$ (in which x and y each is a natural number), Ar, He and other rare gases can be used. A mixed gas composed of $N_2$ gas and $O_2$ gas and a mixed gas composed of $N_2$ and $H_2$ are preferred.

On a silicon substrate, there is formed, as an interfilm insulating film, an organic material film, which is a low-k film, and an inorganic material film having a predetermined pattern is formed thereon. Thereon is further formed a BARC film, and a resist film is formed thereon. The inorganic material film may be made of an ordinary hard mask material; silicon oxides, silicon nitrides and silicon oxynitrides may be mentioned as preferred examples. The organic material film is a low-k film used as an interfilm insulating film and is markedly low in relative permittivity as compared with a silicon oxide which is a conventional interfilm insulating film material. Available as the organic low-k film material are, for example, polyorganosiloxane-crosslinked bisbenzocyclobutene resins (BCBs), polyarylene ether resins (PAEs) such as Dow Chemical's SiLK (trademark) and FLARE (trademark), and organopolysiloxane resins such as methylsilsesquioxane (MSQ). The organopolysiloxane, so referred to herein, refers to one having a C- and H-containing functional group-containing structure in the bond structure of a silicon oxide film, as shown below.

The treatment target substrate is, for example, a conductor wafer or an LCD substrate. The invention can be applied not only to the cases where an organic material film is etched with an inorganic material film as a mask but also to all the cases where an organic material film is to be etched selectively with respect to an inorganic material film. For example, the present invention can be applied to ashing for removing the resist used as a mask on the occasion of etching of an inorganic material film such as a $SiO_2$ film formed on the treatment target substrate such as a Si wafer. Thus, while, in ashing, it is necessary to remove the resist film, which is an organic material film, selectively and efficiently while avoiding the etching of the underlying inorganic material film as much as possible. Good ashing characteristics can be obtained by applying the present invention to ashing.

In the fourth aspect of the invention, the duty ratio of the direct-current pulse voltage on the occasion of discharge plasma generation by applying the direct-current pulse voltage to the treatment gas is controlled within the range of from 0.001% to 8.0%, inclusive, and the treatment gas involved in discharge plasma generation is utilized as a plasma source for producing negative ions.

In the prior art methods using a pulse-modulated plasma, positive ions are formed during the plasma-on half of the period and, therefore, negative ions are formed only during the half of the treatment time. Therefore, the efficiency as a negative ion generator is low.

On the contrary, according to the present invention, a direct-current pulse voltage is used and the duty ratio thereof is controlled at a level of 8.0% or lower and thus plasma discharge can be successfully sustained. Since negative ions are generated by employing such discharge plasma, the zone of the voltage-off time during which negative ions can be formed is markedly long and the negative ion production efficiency is very high. In addition, the discharge plasma generated in accordance with the present invention is low in electron temperature and, in this respect, too, the negative ion production efficiency becomes still higher.

This negative ion production and etching treatment can be carried out according to the description in Japanese Patent No. 3647303B, for instance. Thus, a first gas is introduced into the plasma generation space, electric energy is supplied to the first gas in the plasma generation space to generate a plasma, the plasma is introduced into a negative ion production space in communication with the plasma generation space and is mixed with a second gas for negative ion production, and the negative ions are fed to a treatment target.

The first gas is a simple substance halogen element gas such as $F_2$, $Cl_2$, $I_2$, $Br_2$ or the like, a halogen compound gas such as $CF_4$, $C_2F_6$, $C_3F_8$, $CCl_2F_2$, $CBrF_3$, $CCl_4$, $C_2Cl_2F_4$, $BCl_3NF_3$ or the like, or an oxygen-containing gas such as $O_2$, $O_3$ or the like.

In the plasma generation space, a plasma mainly composed of positive ions and electrons is generated at the stage of first gas introduction. And, this plasma is introduced into the negative ion production space and mixed with a second gas having a temperature lower than the plasma temperature to thereby rapidly lower the plasma temperature to about 1 eV, for instance. As a result, the probability of sticking of plasma-constituting electrons to neutral atoms increases, and negative ions are formed by binding of neutral atoms with electrons and by dissociation of neutral molecules upon sticking of electrons thereto.

As examples of the second gas to be later introduced into the treatment chamber, there may be mentioned halogen gases such as fluorine, chlorine, bromine, iodine and the like, and inert gases such as helium, neon, argon, xenon and the like. The second gas may be any one having a lower temperature as compared with the first gas plasma and may contain molecules, neutral active atoms, ions and/or electrons. Preferred as the second gas lower in temperature than the plasma are negative gases high in electronegativity, for example halogen gases such as fluorine, chlorine, bromine, iodine, and the like. In a halogen gas plasma, binding of neutral atoms or molecules with electrons readily occurs and, therefore, negative ions are readily formed abundantly.

As examples of the treatment with the negative ions formed, there may be mentioned etching, ashing, cleaning and other useless matter removing treatment processes.

As more specific examples, there may be mentioned etching of silicon and silicon compounds such as silicon oxide, silicon nitride and the like, etching of metals, silicides and the like, photoresist ashing, ashing or cleaning of denatured cured photoresist films, foreign matter cleaning of semiconductor, insulator, silicide or metal surfaces, and removal of autoxidation product films.

In the fifth aspect of the invention, the duty ratio of the direct-current pulse voltage on the occasion of discharge plasma generation by applying the direct-current pulse voltage to the treatment gas is controlled within the range of from 0.001% to 8.0%, inclusive, and the discharge plasma generated is used in an oxidation or nitriding treatment process.

In WO2004/107430, a discharge plasma is generated by using a pulse voltage for carrying out an oxidation or nitriding treatment. However, the pulse voltage duty ratio is from 20% to 80%. Such plasma has a relatively high electron temperature and readily damages oxide films and nitride films, leading to the occurrence of defects. In accordance with the present invention, a low electron temperature discharge plasma is successfully generated and sustained by using a direct-current pulse voltage duty ratio not higher than 8.0%, and an oxidation or nitriding treatment is possible using that plasma. By using such plasma, it is possible to carry out the oxidation or nitriding treatment efficiently while inhibiting the occurrence of damages to or defects on oxide or nitride films.

In the practice of the invention, a treatment target member is placed on a support or stage and brought into contact with the above-mentioned discharge plasma. The treatment target member is not particularly restricted but includes, among others, known substrates for electronic devices, specifically semiconductor materials and materials for liquid crystal devices. As the semiconductor materials, there may be mentioned single crystal silicon, and silicon- and germanium-based materials, for instance. As the liquid crystal device materials, there may be mentioned polysilicon and amorphous silicon.

The stage can be made of a ceramic material or a metal. When the stage is made of a metal, it can be used as the lower electrode or upper electrode of the counter electrode system. When the stage is made of a ceramic material, the lower electrode or upper electrode of the counter electrode system can be embedded within the stage.

The treatment gas for the oxidation treatment of a treatment target member may be, for example, an oxygen gas or an oxygen atom-containing gas. Such gas may be mixed with an inert gas. The treatment gas for the nitriding treatment of a treatment target member may be, for example, nitrogen gas or a nitrogen atom-containing gas. Such gas may be mixed with an inert gas. Such inert gas may be, for example, krypton, xenon, helium or argon.

EXAMPLES

Experiment 1

Figure 3:
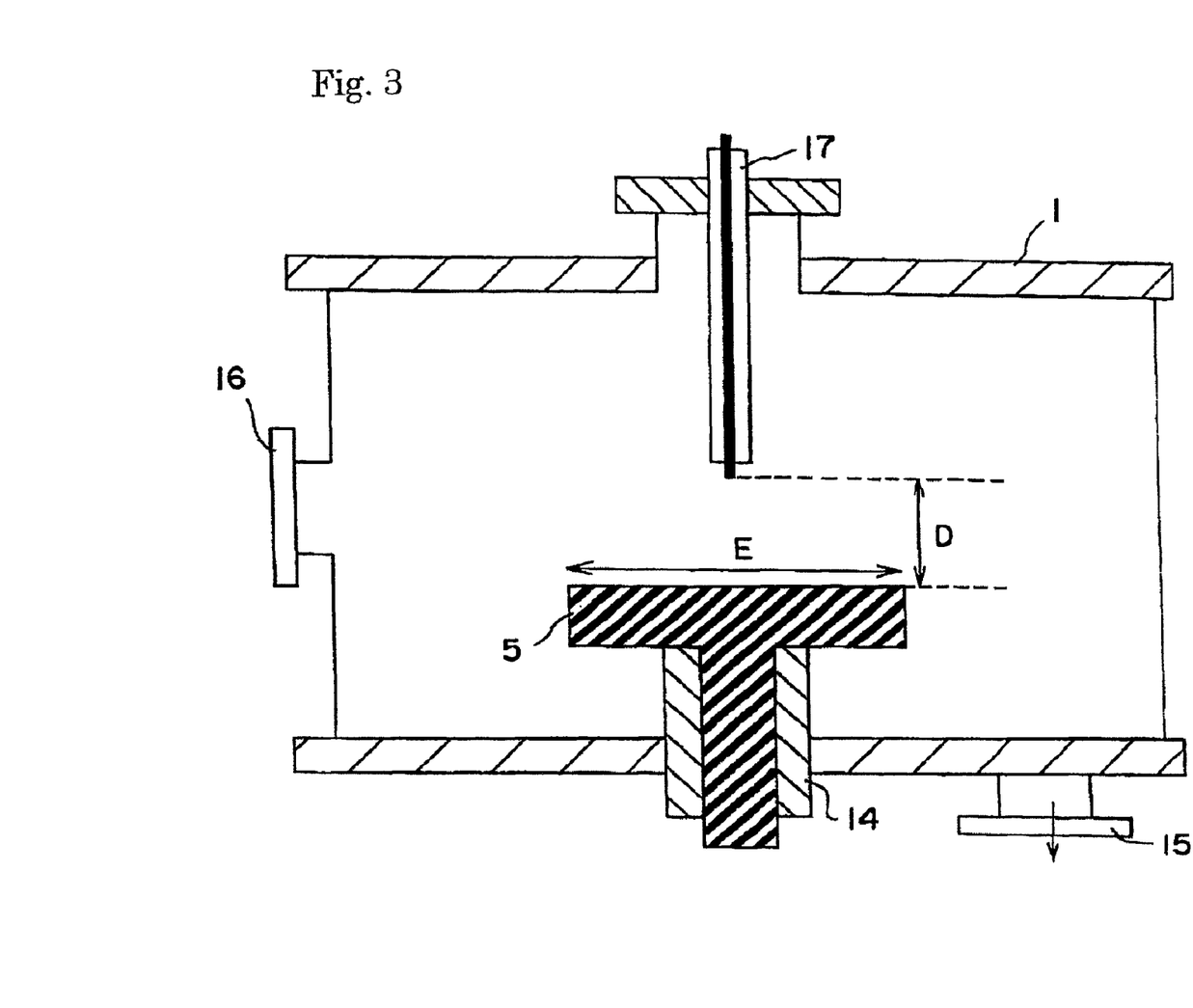
FIG. 3 is a schematic view of an apparatus utilizable in carrying out the plasma generation method according to the invention.

Using such a plasma generator as shown in FIG. 3, glow discharge was caused to occur and a plasma was generated. The stainless steel chamber 1 was roughly discoid shape with a height of 300 mm and a diameter ø of 300 mm. The chamber 1 had a view window 16, a Langmuir probe 17 and a stainless steel electrode 5, each fixed thereto. The electrode 5 and chamber 1 was insulated from each other with an insulator 14. The height D of the probe was 60 mm, and the diameter E of the electrode 5 was 100 mm. The power source used was a direct-current pulse power source in which an electrostatic induction thyristor device was used.

The inside of the chamber 1 was evacuated using an oil-sealed rotary pump and a turbo-molecular pump, and argon gas was allowed to flow into the chamber until a pressure of 2.6 Pa. Here, a positive pulse was applied periodically. The crest value of the positive pulse was +10.0 kV, and the frequency was 1 kHz to 10 kHz. The half width of the positive pulse was 1000 nsec. Here, the duty ratio of the direct-current pulse voltage was varied, as shown in Table 1.

The experiment was also carried out under conditions under which a negative pulse alone was applied periodically; the crest value of the negative pulse was −10 kV and the frequency thereof was 1 kHz to 10 kHz. The half width of the negative pulse was 1000 nsec, and the duty ratio of the direct-current pulse voltage was varied, as shown in Table 1.

Further, as a reference example, such a chamber as shown in FIG. 3 was used, and a high-frequency voltage with a frequency of 13.56 MHz was continuously applied in lieu of the above-mentioned direct-current pulse voltage. The high-frequency voltage value was Vpp=1000 V. The "Vpp" is the difference between the maximum voltage value and minimum voltage value. Since the voltage application was continuous, the duty ratio was 100%. In each example, the plasma electron density and electron temperature were measured by the Langmuir probe method.

TABLE 1

| experiment | Pulse voltage duty ratio (%) | Pulse polarity | Electric power supplied $W/cm^2$ | Electron density × $10^{10} cm^{-3}$ | Electron temperature eV |
|---|---|---|---|---|---|
| 1-1 | 0.1 | Positive pulse | 0.8 | 5.0 | 1.0 |
| 1-2 | 0.1 | Positive pulse | 1.0 | 10.0 | 0.5 |
| 1-3 | 0.5 | Positive pulse | 1.8 | 28.0 | 0.4 |
| 1-4 | 1.0 | Positive pulse | 2.5 | 37.8 | 0.3 |
| 1-5 | 0.1 | Negative | 0.8 | 0.8 | 2.0 |

TABLE 1-continued

| experiment | Pulse voltage duty ratio (%) | Pulse polarity | Electric power supplied W/cm$^2$ | Electron density × 10$^{10}$ cm$^{-3}$ | Electron temperature eV |
|---|---|---|---|---|---|
| 1-6 | 0.1 | Negative pulse | 1.0 | 1.1 | 1.0 |
| 1-7 | 0.5 | Negative pulse | 1.8 | 2.4 | 0.9 |
| 1-8 | 1.0 | Negative pulse | 2.5 | 4.8 | 0.8 |

As is evident from the above results, a discharge plasma high in electron density and low in electron temperature can be generated when the electric power supply per discharge electrode unit area is not lower than 1.0 W/cm$^2$.

Experiment 2

Using an apparatus as described hereinabove referring to FIG. 2, a thin diamond-like carbon film was produced as mentioned hereinabove. The stainless steel chamber 1 was roughly discoid shape with a chamber height of 300 mm and a diameter ø of 300 mm. The power source used was a direct-current pulse power source in which an electrostatic induction thyristor device was used.

The inside of the chamber 1 was evacuated using an oil-sealed rotary pump and an oil-sealed diffusion pump until arrival of the pressure in the inside of the chamber 1 at 1×10$^{-2}$ Pa to 1×10$^{-3}$ Pa. Then, acetylene gas was fed to the chamber through a gas supply port until arrival of the pressure within the chamber 1 at 2.6 Pa. Then, a direct-current pulse voltage was applied between the upper electrode 4 and lower electrode 5.

Here, a positive pulse 11 and a negative pulse 12 were applied alternately and periodically. The crest value of the positive pulse 11 was +10.0 kV, and the crest value of the negative pulse 12 was −10.0 kV. The positive pulse frequency was 1 kHz to 5 kHz, and the interval t between the positive pulse and negative pulse was 20.0 μsec. The half width d1 of the positive pulse 11 was 150 nsec, and the half width d2 of the negative pulse 12 was 200 nsec. Here, the direct-current pulse voltage duty ratio was varied, as shown in Table 2. A thin diamond-like carbon film 7 was formed by 60 minutes of discharge under application of the direct-current pulse voltage. The rate of film formation in each example was as shown in Table 2.

TABLE 2

| Experiment | Pulse voltage duty ratio (%) | Electric power supplied W/cm$^2$ | Film formation rate (μm/hour) |
|---|---|---|---|
| 2-1 | 0.03 | 1.0 | 1.2 |
| 2-2 | 0.05 | 1.2 | 1.8 |
| 2-3 | 0.07 | 1.4 | 2.5 |
| 2-4 | 0.07 | 1.5 | 3.0 |
| 2-5 | 0.10 | 1.6 | 3.5 |
| 2-6 | 0.12 | 1.9 | 3.8 |
| 2-7 | 0.14 | 2.2 | 4.3 |
| 2-8 | 0.14 | 2.5 | 5.0 |

Referring to Table 2, Raman spectroscopic analysis was carried out in Experiments 2-1 to 2-8 using a Raman spectrometer (product of Nippon Bunko (JASCO Corp.), "NRS-1000"). Diamond-like carbon-due scattering peaks were observed at about 1360 cm$^{-1}$ and about 1580 cm$^{-1}$, indicating the formation of a diamond-like carbon film.

Experiment 3

Using an apparatus as described hereinabove referring to FIG. 2, a thin diamond-like carbon film was produced as mentioned hereinabove. The stainless steel chamber 1 was roughly discoid shape with a chamber height of 300 mm, and the substrate diameter ø was 300 mm. The power source used was a power source in which an electrostatic induction thyristor device was used. This power source is the one descried in Japanese Patent No. 3811681B.

The inside of the chamber 1 was evacuated using an oil-sealed rotary pump and an oil-sealed diffusion pump until arrival of the pressure in the inside of the chamber 1 at 1×10$^{-2}$ Pa to 1×10$^{-3}$ Pa. Then, acetylene gas was fed to the chamber through a gas supply port until arrival of the pressure within the chamber 1 at 1.0 Pa. Then, a direct-current pulse voltage was applied between the upper electrode 4 and lower electrode 5.

Here, a negative pulse 12 alone was applied periodically. The crest value of the negative pulse 12 was −15 kV, and the negative pulse frequency was 10 kHz. The half width d2 of the negative pulse 12 was 200 nsec. Here, the direct-current pulse voltage duty ratio was 0.8%, and the voltage rise time was 20 V/nsec. A thin diamond-like carbon film 7 was formed by 60 minutes of discharge under application of the direct-current pulse voltage.

Figure 5:
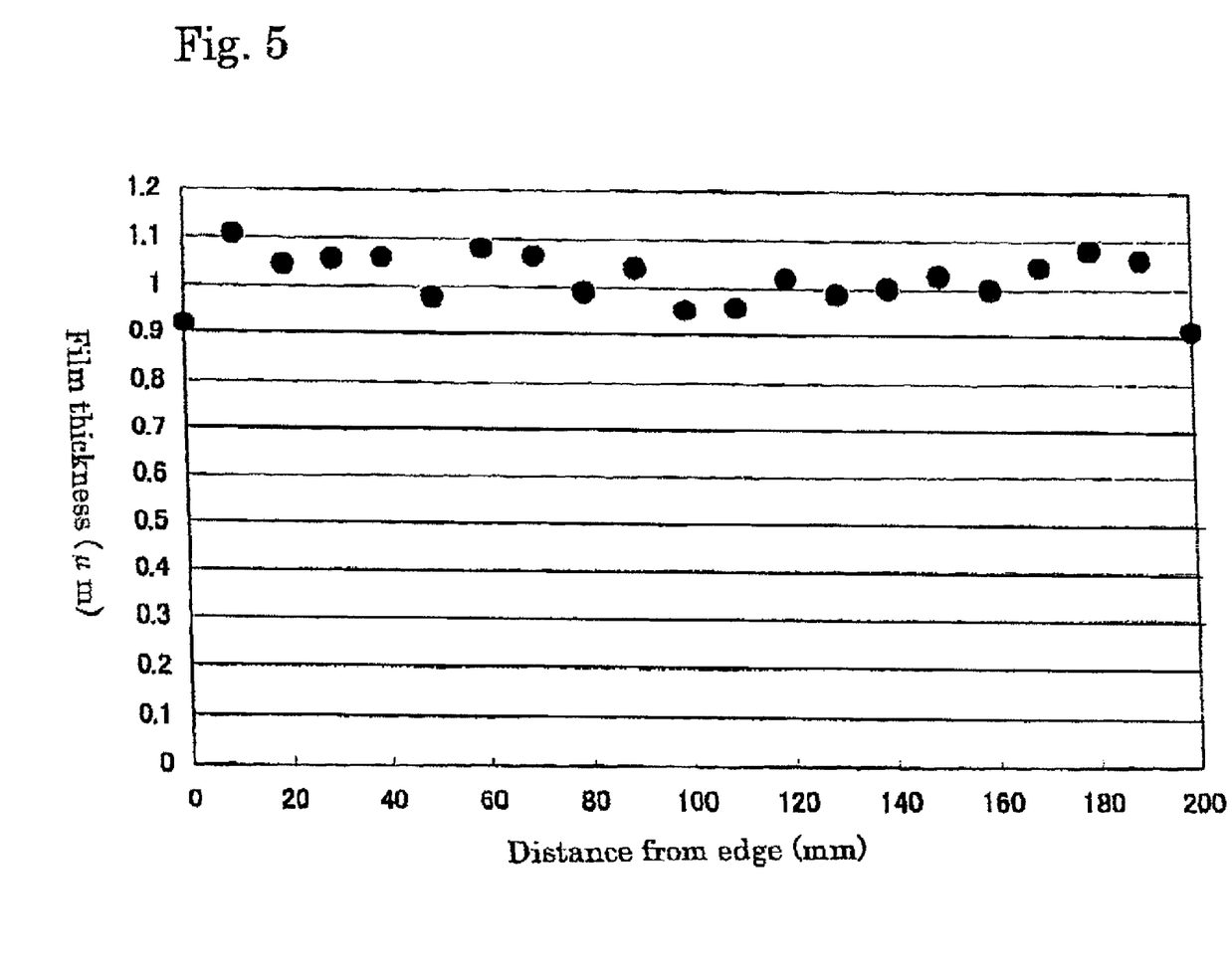
FIG. 5 is a graphic view of the relation between the position of a diamond film and the film thickness.

The in-plane homogeneity of the plasma was indirectly evaluated by measuring the in-plane film thickness distribution of the thin diamond film obtained. The results obtained are shown in FIG. 5. As shown in FIG. 5, it could be confirmed that a uniform film thickness distribution within ±8% was obtained except for the 5-mm-wide peripheral portion of the φ 200 electrode.

Experiment 4

Using an apparatus as described hereinabove referring to FIG. 2, a plasma was generated and utilized for impurity implantation into a silicon wafer. The stainless steel chamber 1 was roughly discoid shape, the chamber height was 300 mm, and the silicon wafer had a diameter φ of 200 mm.

The inside of the chamber 1 was evacuated using an oil-sealed rotary pump and an oil-sealed diffusion pump until arrival of the pressure of the inside of the chamber 1 at 1×10$^{-2}$ Pa to 1×10$^{-3}$ Pa. Then, nitrogen gas was fed to the chamber through a gas supply port until arrival of the pressure within the chamber 1 at 1.0 Pa. Then, a direct-current pulse voltage was applied between the upper electrode 4 and lower electrode 5.

Figure 6:
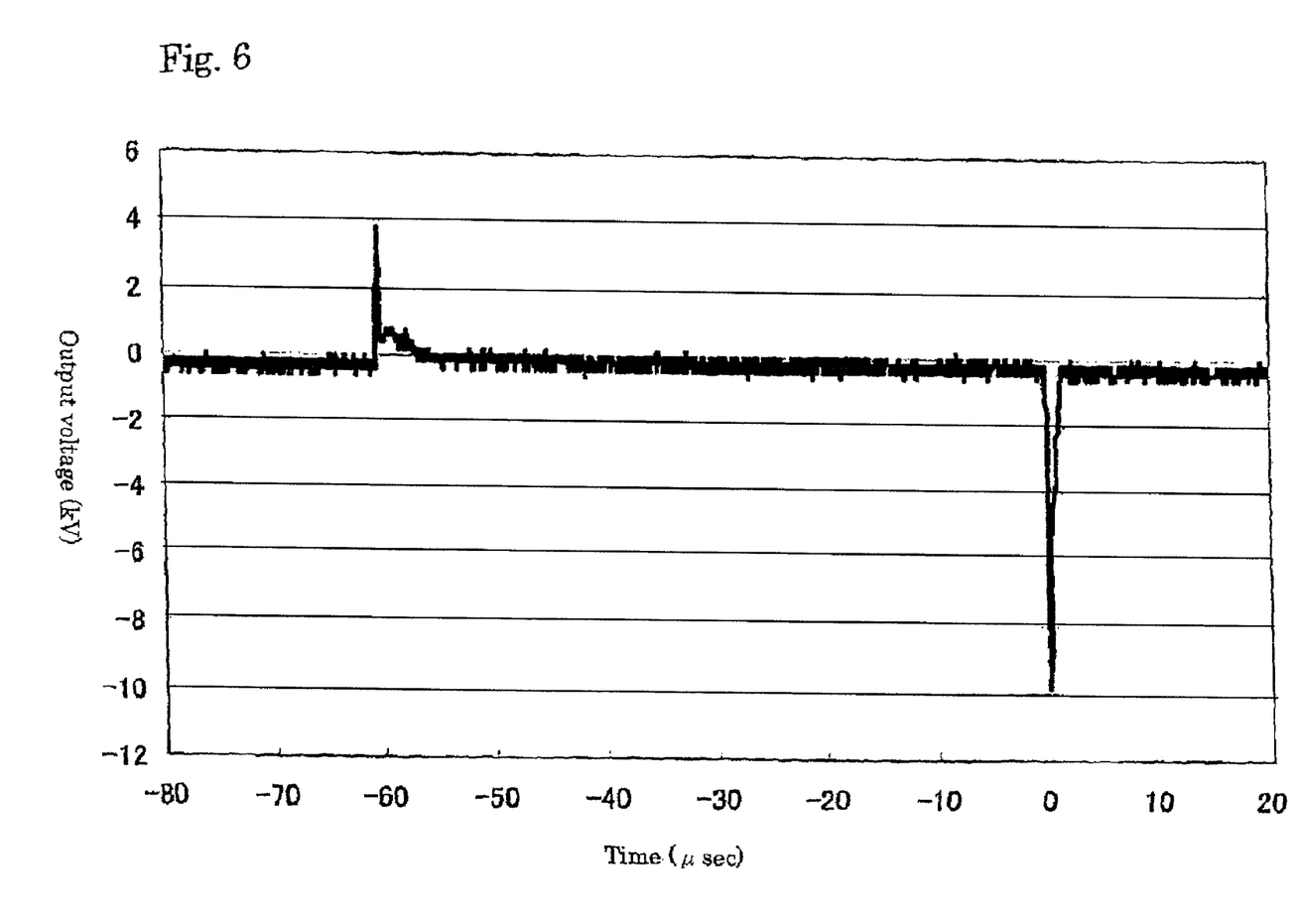
FIG. 6 is a view of the pulse voltage waveform utilized in plasma ion implantation.

Here, a positive pulse and a negative pulse were applied alternately and periodically. The pulse form was as shown in FIG. 6. The crest value of the positive pulse was +4 kV, the crest value of the negative pulse was −10 kV, the positive pulse frequency was 2 kHz, and the distance t between the positive pulse and negative pulse was 60.0 μsec. The half width d1 of the positive pulse was 0.8 μsec, and the half width d2 of the negative pulse was 200 nsec. Here, the direct-current pulse voltage duty ratio was 0.8%, the pulse period was 2 kHz, and the voltage rise time was 20 V/nsec. Discharge was allowed to occur for 60 minutes under application of the direct-current pulse voltage.

Figure 7:
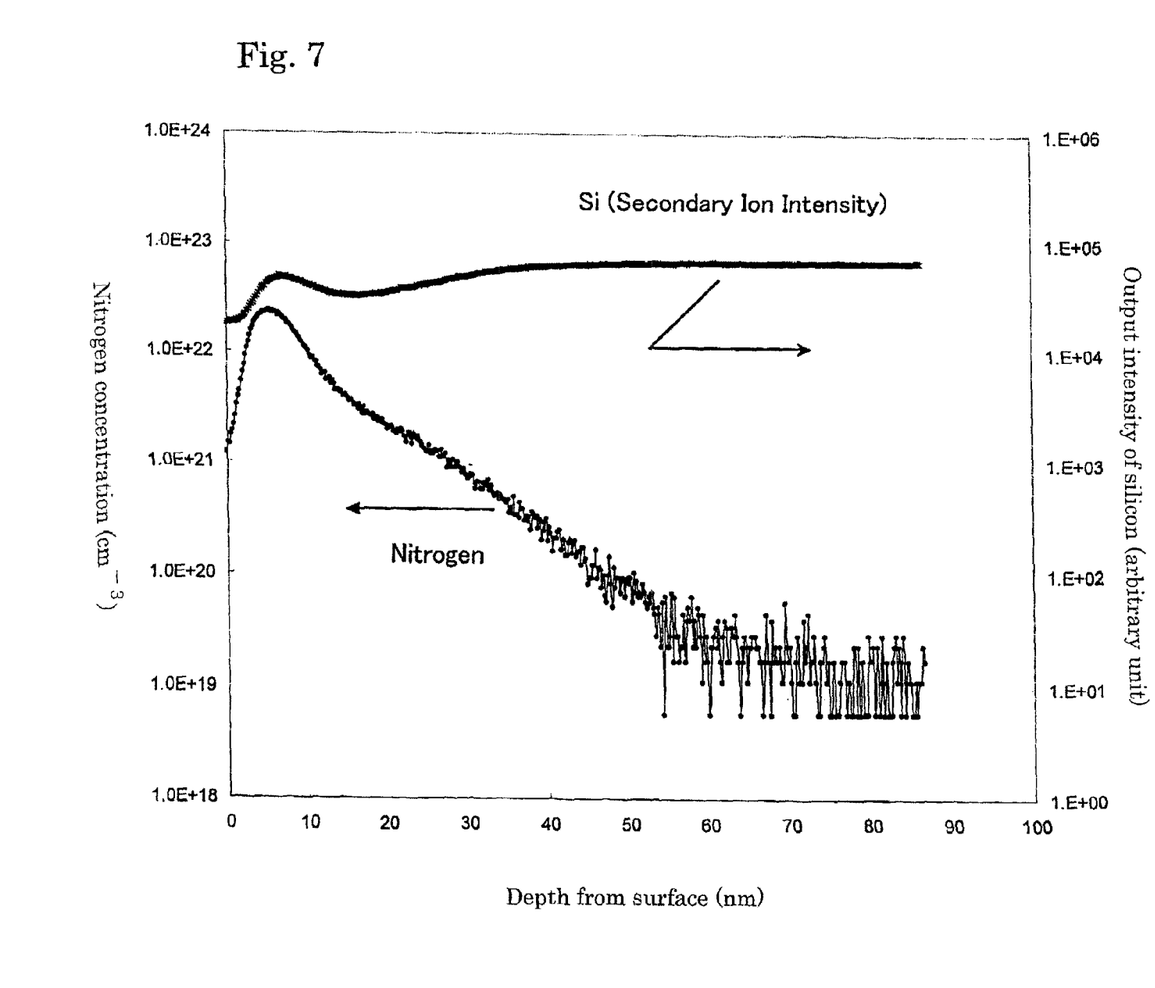
FIG. 7 is a graphic view of the relation between the depth from the wafer surface and the impurity concentration.

The depth of impurity (nitrogen atom) implantation in the silicon wafer after treatment was measured using a secondary ion mass spectrometer (SIMS apparatus). The results are shown in FIG. 7. The abscissa denotes the depth from the wafer surface, the left ordinate denotes the nitrogen concentration in silicon, and the right ordinate denotes the silicon element secondary ion output. As is seen from the results, a remarkable nitrogen concentration peak was found at a definite depth from the surface, indicating that nitrogen atoms could be implanted into the silicon wafer at a relatively uniform depth.

While certain specific modes of embodiment of the present invention have been described, these specific modes of embodiment are by no means limitative of the scope of the invention. It is to be noted that those skilled in the art can make various alterations and modifications without departing from the scope of the claims appended hereto.

The invention claimed is:

1. A plasma generation method comprising the step of:
applying a direct-current pulse voltage on a treatment gas with a discharge electrode to generate a discharge plasma,
wherein the direct-current pulse voltage has a duty ratio controlled within the range of 0.001% or more and 8.0% or less;
wherein the direct-current pulse voltage has a voltage rise time of 0.1 V/nsec or more and 10000 V/nsec or less; and
wherein the direct-current pulse voltage has an electrical power supplied per unit area of the discharge electrode of 1.0 W/cm$^2$ or higher.

2. The method according to claim 1, wherein the treatment gas with the discharge plasma generated therein is used as a plasma source for carrying out impurity implantation in a semiconductor process.

3. The method according to claim 1, wherein the discharge plasma has an electron density of not lower than $1 \times 10^{10}$ cm$^{-3}$ and an electron temperature of not higher than 1.5 eV.

4. The method according to claim 1, wherein the discharge plasma comprises a glow discharge plasma.

5. The method according to claim 1, wherein the direct-current pulse voltage has a frequency of not lower than 0.1 kHz and not higher than 100 kHz and a pulse half width of not higher than 3000 nsec.

6. The method according to claim 1, wherein the discharge electrode comprises counter electrodes and an electric field strength between the counter electrodes is from 0.01 kV/cm to 100 kV/cm.

7. The method according to claim 1, wherein the treatment gas has a pressure of 100 Pa or lower.

8. A method of impurity implantation into a semiconductor, the method comprising the steps of:
applying a direct-current pulse voltage on a treatment gas with a discharge electrode to generate a discharge plasma, the direct-current pulse voltage having a duty ratio controlled within the range of 0.001% or more and 8.0% or less; and
utilizing the treatment gas with the discharge plasma generated therein as a plasma source for impurity implantation into a semiconductor,
wherein the discharge plasma generation and the impurity implantation are carried out while applying a positive pulse and a negative pulse from a single power source;
wherein the direct-current pulse voltage has an electrical power supplied per unit area of the discharge electrode of 1.0 W/cm$^2$ or higher; and
wherein the direct-current pulse voltage has a voltage rise time of 0.1 V/nsec or more and 10,000 V/nsec or less.

9. The method according to claim 8, wherein the discharge plasma has an electron density of not lower than $1 \times 10^{10}$ cm$^{-3}$ and an electron temperature of not higher than 1.5 eV.

10. The method according to claim 8, wherein the discharge plasma comprises a glow discharge plasma.

11. The method according to claim 8, wherein the direct-current pulse voltage has a frequency of not lower than 0.1 kHz and not higher than 100 kHz and a pulse half width of not higher than 3000 nsec.

12. The method according to claim 8, wherein the discharge electrode comprises counter electrodes and an electric field strength between the counter electrodes is from 0.01 kV/cm to 100 kV/cm.

13. The method according to claim 8, wherein the treatment gas has a pressure of 100 Pa or lower.

* * * * *